(12) United States Patent
Akieda et al.

(10) Patent No.: US 9,217,760 B2
(45) Date of Patent: Dec. 22, 2015

(54) CURRENT SENSOR

(71) Applicant: FUJITSU COMPONENT LIMITED, Tokyo (JP)

(72) Inventors: Shinichiro Akieda, Tokyo (JP); Akio Nakamura, Tokyo (JP); Nobuyoshi Shimizu, Tokyo (JP); Shigemi Kurashima, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 143 days.

(21) Appl. No.: 14/071,786

(22) Filed: Nov. 5, 2013

(65) Prior Publication Data

US 2014/0167750 A1   Jun. 19, 2014

(30) Foreign Application Priority Data

Dec. 19, 2012   (JP) .................................. 2012-276459

(51) Int. Cl.
*G01R 1/04* (2006.01)
*G01R 33/02* (2006.01)
*G01R 15/20* (2006.01)
*G01R 33/07* (2006.01)
*G01R 11/04* (2006.01)
*G01D 5/14* (2006.01)
*G01D 11/24* (2006.01)

(52) U.S. Cl.
CPC .............. *G01R 15/202* (2013.01); *G01R 11/04* (2013.01); *G01R 33/07* (2013.01); *G01D 5/145* (2013.01); *G01D 11/24* (2013.01); *G01R 1/04* (2013.01); *G01R 15/207* (2013.01)

(58) Field of Classification Search
CPC ............. H01L 2924/30107; H01L 2924/3025; G01R 33/07; G01R 11/04; G01R 1/04; G01D 5/145; G01D 11/24
USPC ................................................... 324/156, 251
See application file for complete search history.

(56) References Cited

U.S. PATENT DOCUMENTS

2010/0039112 A1\*   2/2010   Both et al. ..................... 324/318
2010/0315066 A1\*   12/2010   Hashio et al. ................. 324/156

FOREIGN PATENT DOCUMENTS

JP          11-251167        9/1999

OTHER PUBLICATIONS

Patent Abstracts of Japan, Publication No. 11-251167, published Sep. 17, 1999.

\* cited by examiner

*Primary Examiner* — Reena Aurora
(74) *Attorney, Agent, or Firm* — Staas & Halsey LLP

(57) ABSTRACT

A current sensor includes: a lower housing; a lower magnetic core that is housed in the lower housing, and includes a first gap on which a first hall element for detection of a magnetic field is arrangeable; a central housing that detachably engages with the lower housing, and houses the lower magnetic core along with the lower housing; an upper magnetic core that is arranged on the central housing, and forms a ring structure for surrounding a conductor along with the lower magnetic core; and an upper housing that detachably engages with the central housing, and houses the upper magnetic core along with the central housing.

18 Claims, 16 Drawing Sheets

FIG. 7A
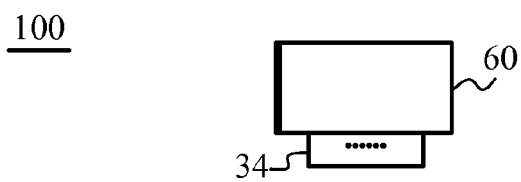
FIG. 7B    FIG. 7C    FIG. 7D    FIG. 7F
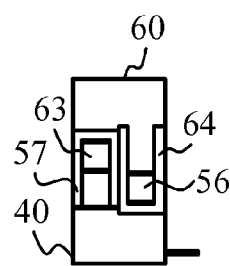 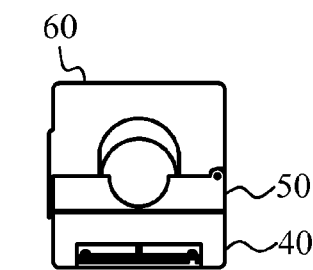 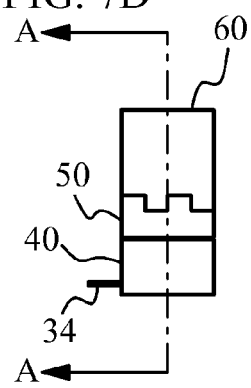 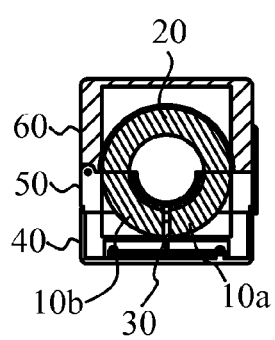
FIG. 7E
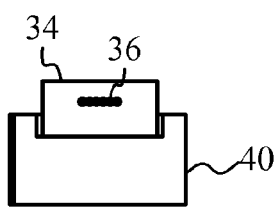

FIG. 9A
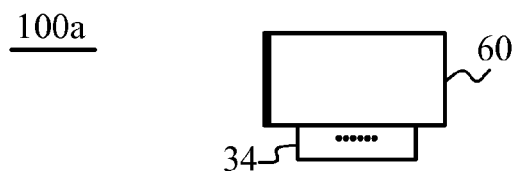
FIG. 9B    FIG. 9C    FIG. 9D    FIG. 9F
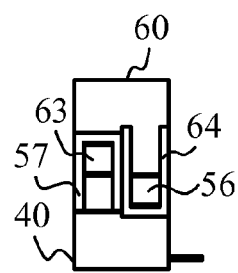 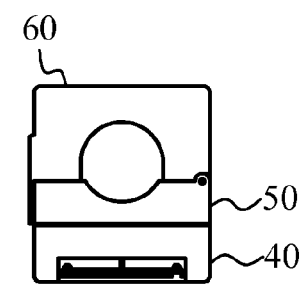 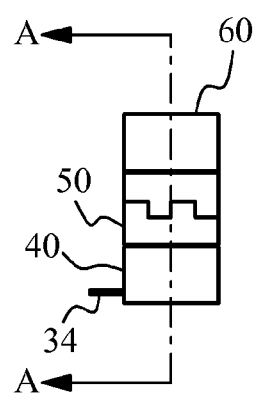 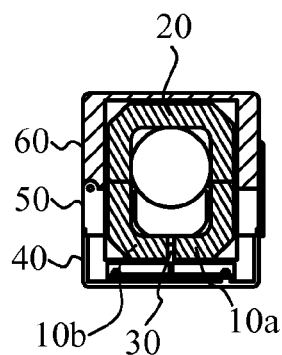
FIG. 9E
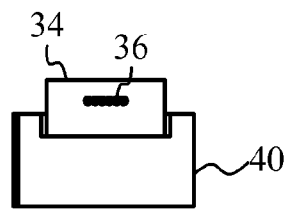

FIG. 13A
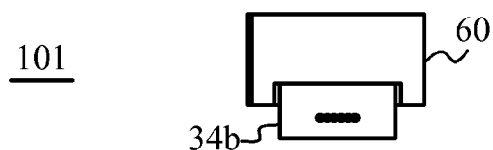
FIG. 13B    FIG. 13C    FIG. 13D    FIG. 13F
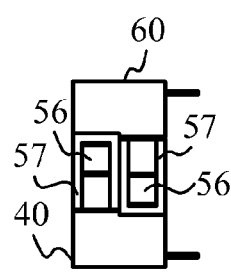 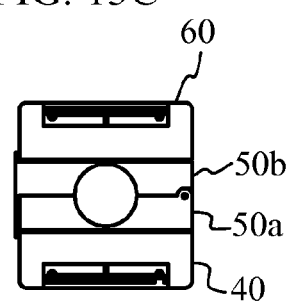 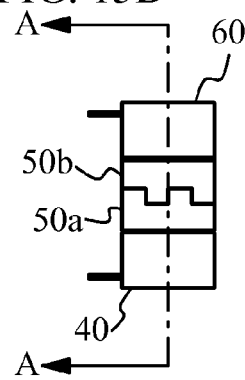 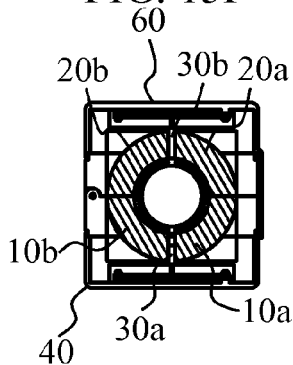
FIG. 13E
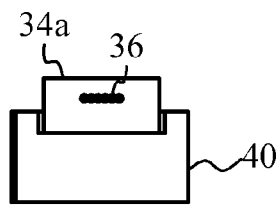

FIG. 16A
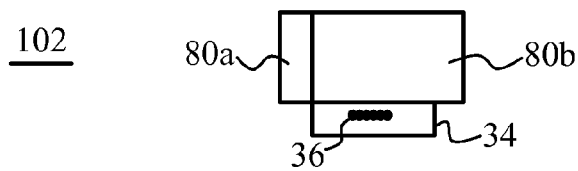
FIG. 16B
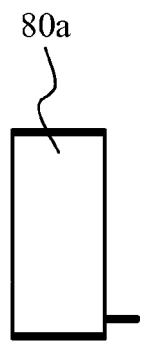
FIG. 16C
FIG. 16D
FIG. 16F
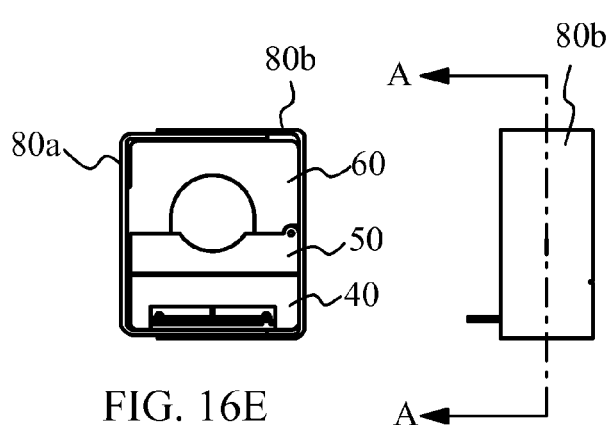
FIG. 16E
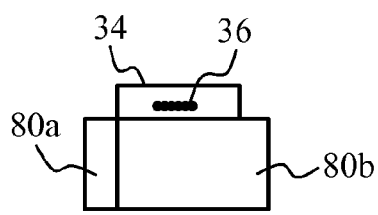

CURRENT SENSOR

CROSS-REFERENCE TO RELATED APPLICATIONS

This application is based upon and claims the benefit of priority of the prior Japanese Patent Application No. 2012-276459 filed on Dec. 19, 2012, the entire contents of which are incorporated herein by reference.

FIELD

A certain aspect of the embodiments is related to a current sensor.

BACKGROUND

There is known a current sensor having a conductor (i.e., a current bar), through which a current to be measured flows, is enclosed with an annular magnetic core, and a hall element for the measurement of a magnetic field is arranged on a gap of the magnetic core. In such an electric power sensor, a position relationship between the magnetic core, the current bar and the hall element is fixed so that the magnetic core, the current bar and the hall element do not contact each other. In Japanese Laid-open Patent Publication No. 11-251167, the magnetic core divided into two upper and lower portions is stored in a housing through a core holder, so that the above-mentioned members are fixed.

SUMMARY

According to an aspect of the present invention, there is provided a current sensor including: a lower housing; a lower magnetic core that is housed in the lower housing, and includes a first gap on which a first hall element for detection of a magnetic field is arrangeable; a central housing that detachably engages with the lower housing, and houses the lower magnetic core along with the lower housing; an upper magnetic core that is arranged on the central housing, and forms a ring structure for surrounding a conductor along with the lower magnetic core; and an upper housing that detachably engages with the central housing, and houses the upper magnetic core along with the central housing.

The object and advantages of the invention will be realized and attained by the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 7A to 7E are plain views of the current sensor according to the first embodiment;

FIG. 7F is a cross-section view of the current sensor according to the first embodiment;

FIGS. 9A to 9E are plain views of the current sensor according to the variation example of the first embodiment;

FIG. 9F is a cross-section view of the current sensor according to the variation example of the first embodiment;

FIGS. 13A to 13E are plain views of the current sensor according to the second embodiment;

FIG. 13F is a cross-section view of the current sensor according to the second embodiment;

FIGS. 16A to 16E are plain views of the current sensor according to the third embodiment; and FIG. 16F is a cross-section view of the current sensor according to the third embodiment.

DESCRIPTION OF EMBODIMENTS

In the above-mentioned conventional current sensor, since many parts are used for fixation of the magnetic core and so on, the detachable work of the magnetic core has been complicated. There is a problem that the versatility of the housing which supports the magnetic core is scarce and it is difficult to use the magnetic core having a different shape properly according to an intended purpose.

First Embodiment

Figure 1A:
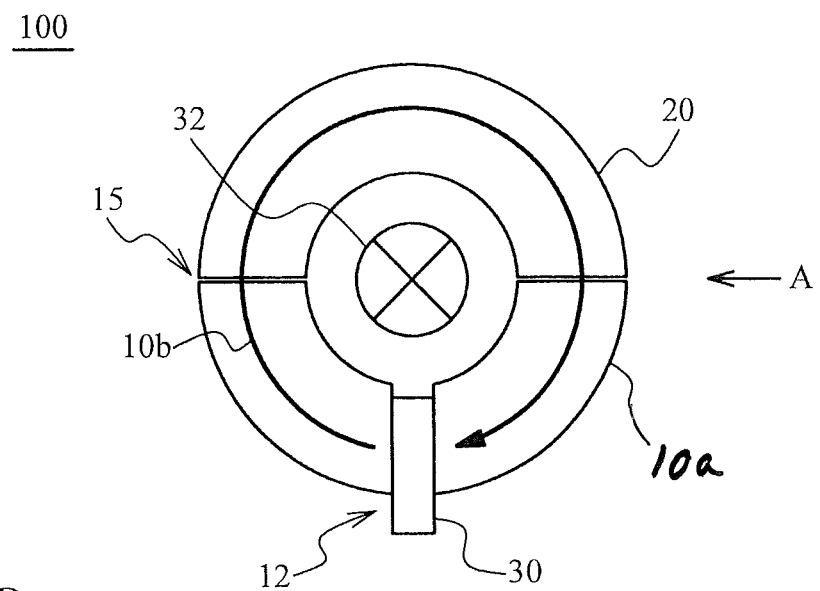
FIGS. 1A and 1B are diagrams illustrating a principle of a current sensor according to the first embodiment.
Figure 1B:
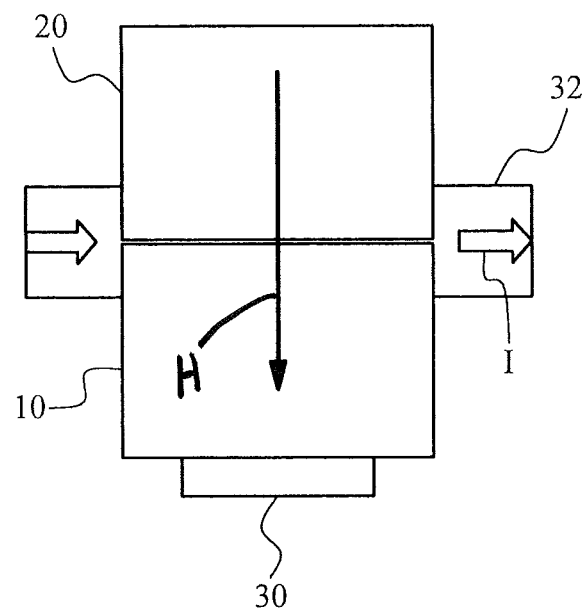

FIGS. 1A and 1B are diagrams illustrating a principle of a current sensor 100 according to the first embodiment. FIG. 1A is a plain view of the current sensor 100 as viewed from a penetration direction of a current bar. FIG. 1B is a side view of the current sensor 100 as viewed from a direction of an arrow A in FIG. 1A. As illustrated in FIGS. 1A and 1B, the current sensor 100 includes an annular magnetic core divided into an upper portion and a lower portion (i.e., a lower magnetic core 10 and an upper magnetic core 20). The lower magnetic core 10 is further divided into two lower magnetic cores 10a and 10b. A hall element 30 for detection of a magnetic field is provided at a gap (hereinafter referred to as "a first gap 12") between the lower magnetic cores 10a and 10b. In fact, the lower magnetic cores 10a and 10b are separated, and the hall element 30 is provided between the lower magnetic cores 10a and 10b.

A conductor (i.e., a current bar 32) through which a current to be measured flows penetrates a central portion of a ring structure formed with the lower magnetic core 10 and the upper magnetic core 20. A circular magnetic field H is formed in the lower magnetic core 10 and the upper magnetic core 20 by a current I flowing through the current bar 32. The magnetic field H is detected by the hall element 30, so that the value of the current can be measured.

Materials, such as permalloy, ferrite, and a nanocrystal material with high permeability, can be used as the lower magnetic core 10 and the upper magnetic core 20, for example. When a relatively soft material, such as the nanocrystal material with high permeability, is used, there is an advantage that the contact characteristic in a portion (i.e., a mark 15) where the lower magnetic core 10 is opposed to the upper magnetic core 20 improves, and the characteristic of the current sensor improves. The soft material, such as the nanocrystal material with high permeability, may be used only for the opposing portion (i.e., the mark 15), and a lower cost material may be used for another portion.

Figure 2:
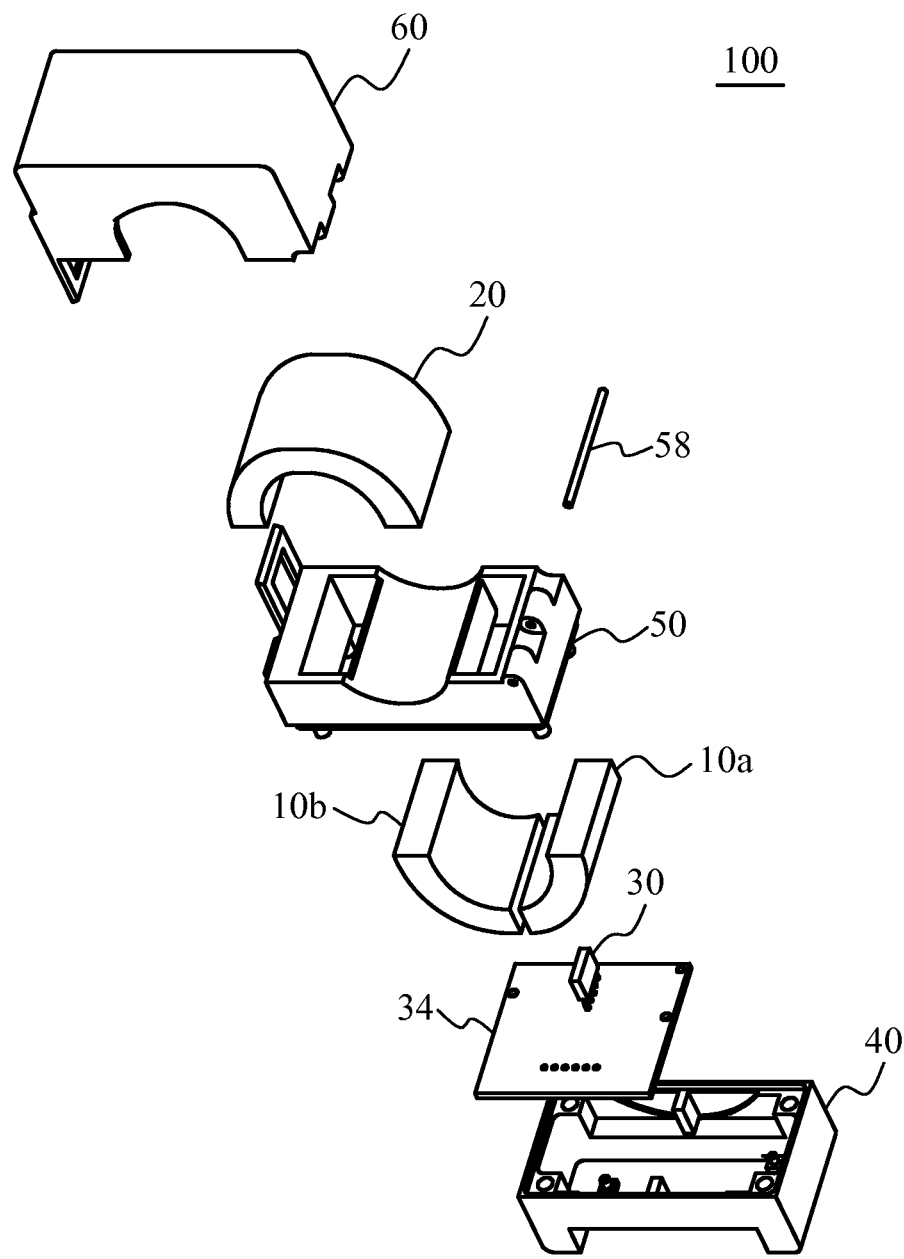
FIG. 2 is an exploded view of the current sensor according to the first embodiment.

FIG. 2 is an exploded view of the current sensor 100 according to the first embodiment. The current sensor 100 includes three housings (i.e., a lower housing 40, a central housing 50, and an upper housing 60) for storing and fixing the lower magnetic core 10 and the upper magnetic core 20. The hall element 30 is mounted on a wiring substrate 34 so as to project from a surface of the wiring substrate 34. The wiring substrate 34 is mounted under the lower magnetic core 10. The lower housing 40 engages with the central housing 50, and houses the lower magnetic core 10 and the wiring substrate 34. The upper housing 60 engages with the central housing 50, and houses the upper magnetic core 20.

Figure 3:
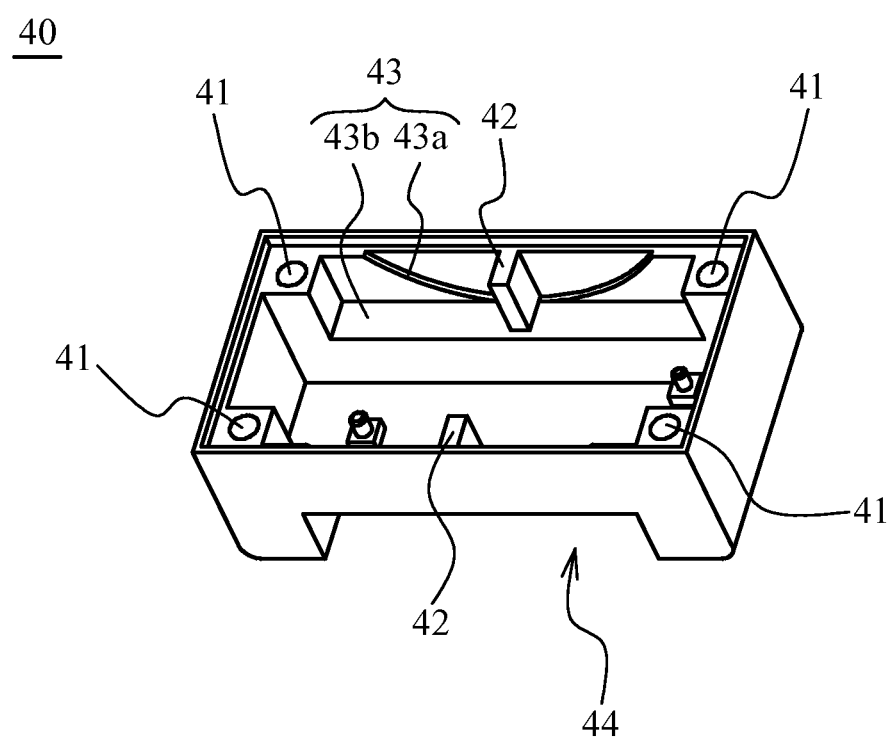
FIG. 3 is a perspective view illustrating the detailed composition of a lower housing.

FIG. 3 is a perspective view illustrating the detailed composition of the lower housing 40. The lower housing 40 includes pin holes 41, separation portions 42, guide portions 43, and an opening portion 44. The pin holes 41 engage with the central housing 50. Pins 52 of the central housing 50 (illustrated in FIG. 4A) are inserted into the pin holes 41, so that the lower housing 40 and the central housing 50 are detachably engaged with each other. The pin holes 41 and the pins 52 are an example of the composition for engaging the lower housing 40 with the central housing 50.

The separation portions 42 are formed so as to project toward the inside from two opposing sides in the inside of the lower housing 40, and are an isolation structure for isolating the lower magnetic cores 10a and 10b. The lower magnetic cores 10a and 10b are separated with the separation portions 42 and are housed, and hence direct contact is prevented by the separation portions 42. Thereby, the first gap 12 that can arrange the hall element 30 is formed. As long as the separation portions 42 can prevent the contact of the lower magnetic cores 10a and 10b, and form the first gap 12, other embodiments of the separation portions 42 may be used.

The guide portions 43 are a supporting structure formed on the two opposing sides of the lower housing 40 and along the shapes of the lower magnetic cores 10a and 10b. In the present embodiment, each of the guide portions 43 includes a curved guide portion 43a that is located along the curved lower magnetic core 10, and a rectangular guide portion 43b that is formed in the inside of the curved guide portions 43a and is located along a rectangular lower magnetic core 10 as described later. A cross-section surface of the lower magnetic core 10 of the present embodiment is approximately a circular shape, as illustrated in FIG. 2, and is arranged along the curved guide portion 43b. In a variation example of FIGS. 8 and 9, a detailed description will be given of a case where a rectangular lower magnetic core 10 is used. Thus, the lower housing 40 can house any one of a plurality types of lower magnetic cores 10 having different shapes.

The opening portion 44 is formed along side surfaces from the bottom surface of the lower housing 40. A width of the opening portion 44 corresponds to a width of the wiring substrate 34 on which the hall element 30 is mounted. Thereby, the wiring substrate 34 can be inserted from the opening portion 44 into the inside of the lower housing 40.

Figure 4A:
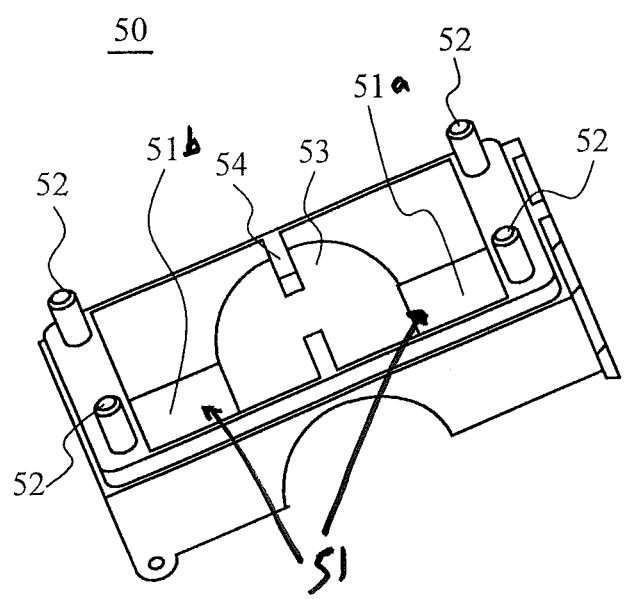
FIGS. 4A and 4B are perspective views illustrating the detailed composition of a central housing.
Figure 4B:
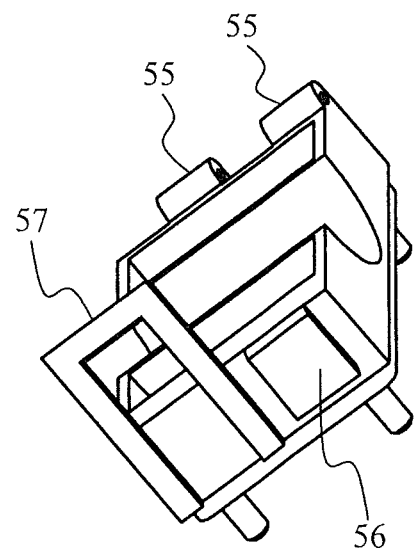

FIGS. 4A and 4B are perspective views illustrating the detailed composition of the central housing 50. The central housing 50 includes a frame body 51, the pins 52, a guide portion 53, separation portions 54, bearing portions 55, an engagement convex portion 56, and an engagement frame portion 57. The frame body 51 fixes portions of the lower magnetic core 10 and the upper magnetic core 20 which are opposed to each other. In the present embodiment, the lower magnetic core 10a is inserted into a frame body 51a, and the lower magnetic core 10b is inserted into a frame body 51b. The pins 52 are engaged with the lower housing 40, as described above.

The guide portion 53 is a supporting structure for supporting the lower magnetic core 10 along a ring structure. The separation portions 54 are formed on central portions of the guide portion 53, and are an isolation structure for preventing the two lower magnetic cores 10a and 10b from contacting mutually. Thus, not only the lower housing 40 but also the central housing 50 has a composition for supporting and separating the lower magnetic core 10. Therefore, the lower magnetic core 10 can be fixed more effectively.

Figure 5:
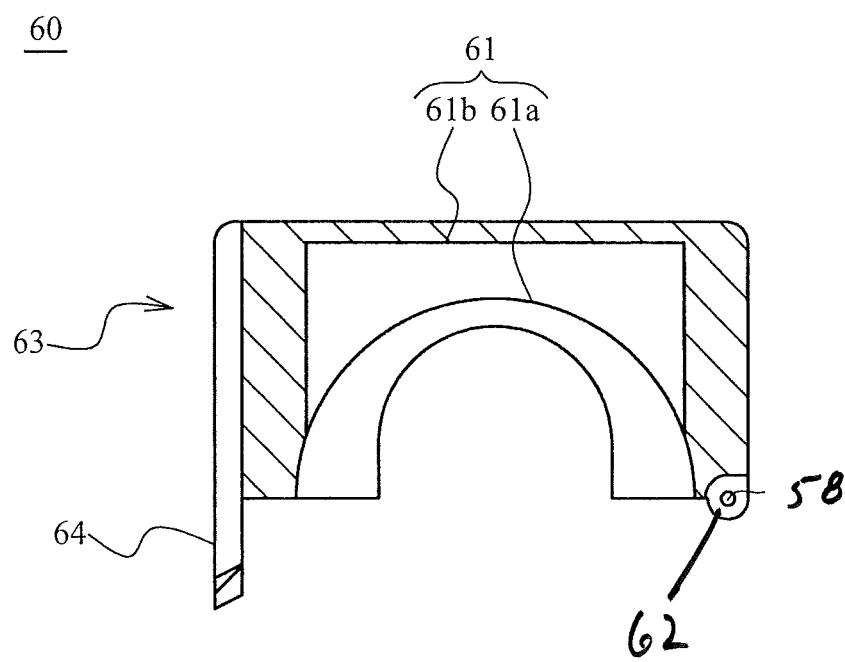
FIG. 5 is a perspective view illustrating the detailed composition of an upper housing.

The bearing portions 55 are formed on one side of an outer circumferential portion of the central housing 50. The bearing portions 55 alternately overlap with the bearing portions 62 of the upper housing 60 as illustrated in FIG. 5. By inserting a shaft 58 into an overlap portion of the bearing portions 55 and 62, the upper housing 60 is rotatably mounted to the central housing 50.

Figure 6A:
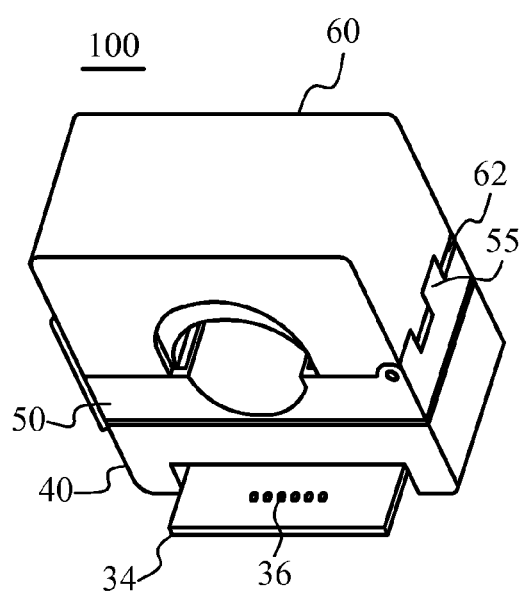
FIGS. 6A and 6B are diagrams of the assembled current sensor according to the first embodiment.
Figure 6B:
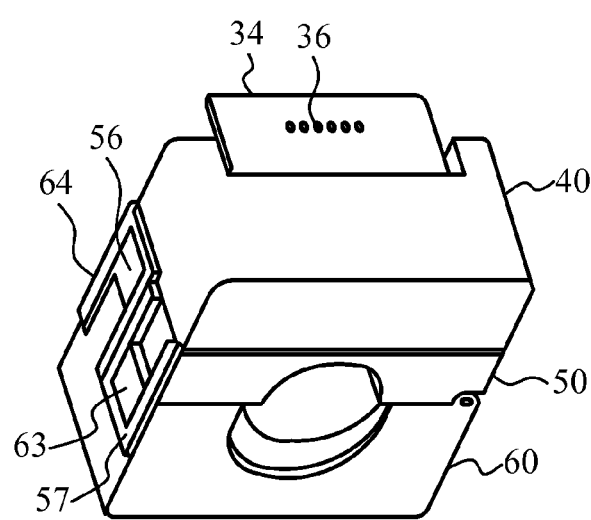

The engagement convex portion 56 and the engagement frame portion 57 are formed on a side opposite to a side on which the bearing portions 55 are formed. The engagement convex portion 56 and the engagement frame portion 57 are formed at positions corresponding to an engagement frame portion 64 and an engagement convex portion 63 as illustrated in FIGS. 5, 6A and 6B. The engagement convex portion 56 of the central housing 50 elastically engages with the engagement frame portion 64 of the upper housing 60, and the engagement frame portion 57 of the central housing 50 elastically engages with the engagement convex portion 63 of the upper housing 60. By such a so-called snap-fit structure, the central housing 50 and the upper housing 60 are engaged with each other. The above-mentioned snap-fit structure is an example of the composition for engaging the central housing 50 with the upper housing 60, and other compositions than the snap-fit structure may be used. By using the snap-fit structure along with the rotatable bearing portions 55 and 62, the upper magnetic core 20 to be housed between the central housing 50 and the upper housing 60 can be taken in and out easily.

Figure 8:
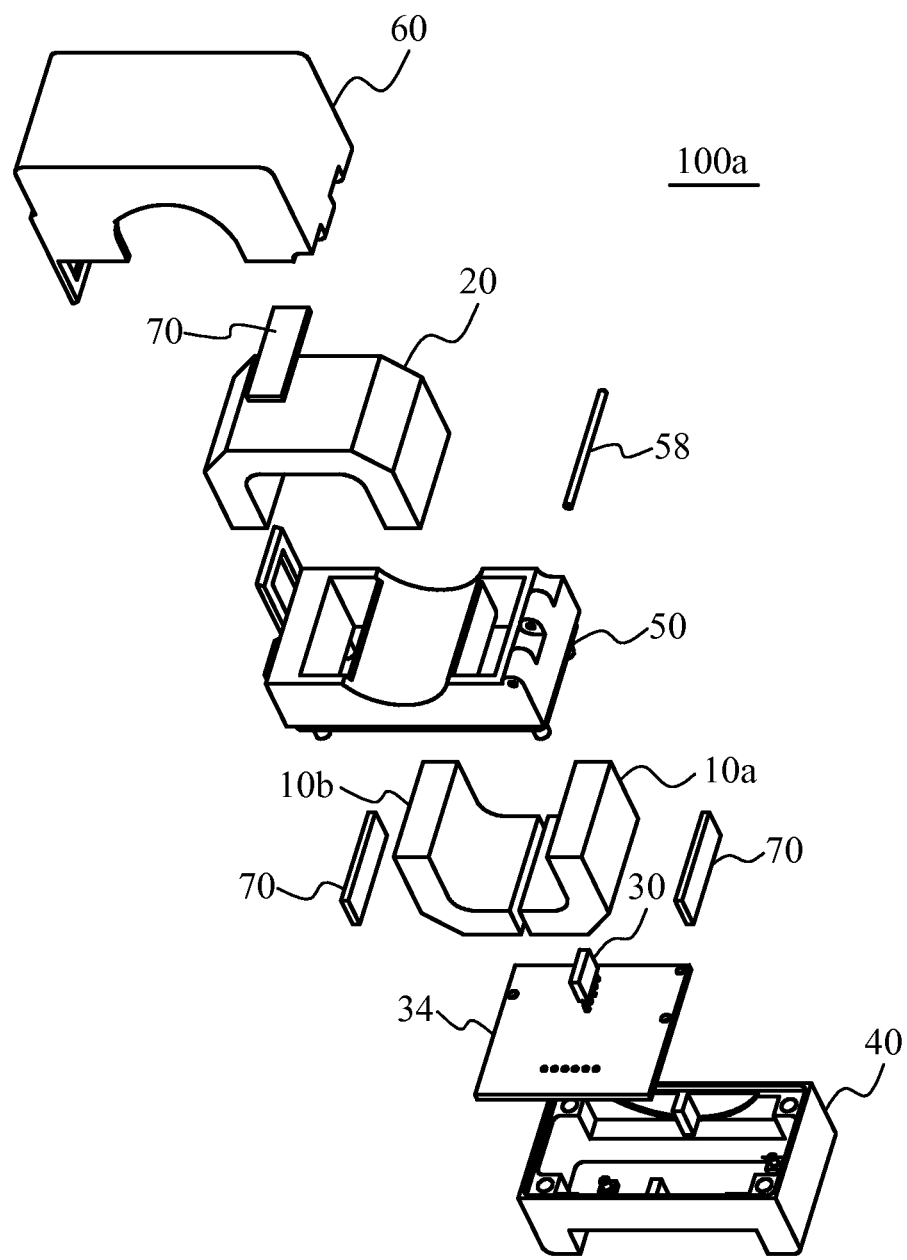
FIG. 8 is an exploded view of the current sensor according to a variation example of the first embodiment.

FIG. 5 is a schematic plain view illustrating the detailed composition of the upper housing 60. The upper housing 60 includes guide portions 61, the bearing portions 62, the engagement convex portion 63 and the engagement frame portion 64. In the composition of the central housing 50, other compositions than the guide portions 61 is already described. As with the guide portions 43 of the lower housing 40, each of the guide portions 61 includes a curved guide portion 61a that is located along the curved upper magnetic core 20, and a rectangular guide portion 61b that is located along a rectangular upper magnetic core 20 as illustrated in FIG. 8. The curved guide portion 61a is formed in the outside of the rectangular guide portion 61b, and the approximately circular upper magnetic core 20 of the present embodiment is fitted into the curved guide portion 61a. Thus, as with the lower housing 40, the upper housing 60 also can house any one of a plurality types of upper magnetic cores 20 having different shapes.

FIGS. 6A and 6B are perspective diagrams of the assembled current sensor 100 according to the first embodiment. The lower housing 40 and the central housing 50 are detachably fixed to each other with the pins 52 and the pin holes 41, not shown. The upper housing 60 and the central housing 50 are openably/closeably and detachably fixed to each other with the bearing portions 55 and 62, the shaft 58, the engagement convex portions 56 and 63, and the engagement frame portions 57 and 64. The wiring substrate 34 is inserted into the opening portion 44 of the lower housing 40. A part of the wiring substrate 34 is exposed from the lower housing 40 outward, and a terminal portion 36 for external connection is formed on the an exposed portion.

FIGS. 7A to 7E are plain views of the current sensor 100 according to the first embodiment. FIG. 7F is a cross-section view of the current sensor 100, taken on a line A-A of FIG. 7D. Specifically, FIG. 7A is a top view, FIG. 7E is a bottom view, FIG. 7C is a front view, and FIGS. 7B and 7D are side views. As illustrated in FIGS. 7A and 7E, a part of the wiring substrate 34 is exposed from the lower housing 40. As illustrated in FIGS. 7B and 7D, the central housing 50 and the upper housing 60 are engaged with each other by the structure in which they are rotatably mounted each other, and the snap-fit structure provided on an opposite surface thereof. In the present embodiment, a part of the upper magnetic core 20 is exposed outside the upper housing 60, as illustrated in FIG. 7C. The current bar 32 through which a current to be measured flows can penetrate an approximately circular space formed by the curved portion of the upper housing 60 and the guide portion 53 of the central housing 50. At this time, the current bar 32 is supported by the guide portion 53 of the central housing 50, so that a gap is generated between the current bar 32 and the upper magnetic core 20. Therefore, the contact of the current bar 32 and the upper magnetic core 20 is restrained.

According to the current sensor of the first embodiment, the central housing 50 located at the central portion houses the respective magnetic cores (i.e., the lower magnetic core 10 and the upper magnetic core 20) together with the lower housing 40 and the upper housing 60. Then, the three housings are detachably engaged with each other. Thus, the magnetic cores can be fixed by only the three components, and hence the current sensor which easily attaches and detaches the magnetic cores and is excellent in versatility can be obtained.

According to the current sensor of the first embodiment, the upper housing 60 is rotatably mounted on one side of the central housing 50, and the upper housing 60 and the central housing 50 are engaged with each other by the engagement portions (i.e., the engagement convex portions 56 and 63, and the engagement frame portions 57 and 64) which are provided on another side opposed to the one side. Thereby, each time the lower magnetic core 10 is replaced, the upper housing 60 and the central housing 50 do not need to be separated, and hence the magnetic core can be detached and attached more easily. It is possible to detach and attach the magnetic core more easily by making the structure of the engagement portions into the snap-fit structure.

Moreover, according to the current sensor of the first embodiment, the lower housing 40 and the upper housing 60 include supporting structures (i.e., guide portions 43a, 43b, 61a and 61b) corresponding to the magnetic cores having different shapes, respectively. Thereby, with the same housings 40, 50 and 60, a plurality of kinds of magnetic cores can be used properly, and hence the versatility of the current sensor 100 can be improved more.

FIG. 8 is an exploded view of a current sensor 101a according to a variation example of the first embodiment, and illustrates an example in which approximately rectangular lower magnetic cores 10a and 10b and an approximately rectangular upper magnetic core 20 are used. FIGS. 9A to 9E are plain views of the current sensor 101a according to the variation example and FIG. 9F is a cross-section view of the current sensor 101a according to the variation example. FIGS. 9A to 9F correspond to FIGS. 7A to 7F, respectively. In the variation example, elastic members 70 are added as additional composition. Hereinafter, a description will be given of the current sensor 100a.

As illustrated in FIG. 9F, each of the lower magnetic cores 10a and 10b is a part of the approximately rectangular magnetic core in which an edge is removed, and is arranged along the guide portion 43b of the lower housing 40. Similarly, the upper magnetic core 20 is also a part of the approximately rectangular magnetic core in which edges are removed, and is arranged along the guide portion 61b of the upper housing 60.

The elastic members 70 are arranged on a space between the lower housing 40 and the lower magnetic core 10 and a space between the upper housing 60 and the upper magnetic core 20, respectively. In the variation example, a part of the magnetic cores does not contact the housings directly, and the magnetic cores and the housings contact each other via the elastic members arranged on the spaces. The lower magnetic core 10 and the upper magnetic core 20 are pressed on the opposite sides of the elastic members 70 by the elastic force of the elastic members 70. Therefore, the magnetic cores can be fixed to the housings more firmly. Especially, when the elastic member 70 is arranged on the upper surface of the upper magnetic core 20, as illustrated in FIG. 8, the elastic member 70 can press the upper magnetic core 20 toward the lower magnetic core 10. Thereby, the contact characteristic in opposite surfaces of the lower magnetic core 10 and the upper magnetic core 20 improves, and the characteristic of the current sensor can improve.

As the elastic member 70, urethane rubber can be used, for example. The elastic member 70 needs to be arranged on at least one of the space between the lower housing 40 and the lower magnetic core 10, or the space between the upper housing 60 and the upper magnetic core 20. When the elastic members 70 are arranged under the upper housing 60 and on the lower housing 40, as illustrated in FIG. 8, the stability of the magnetic cores can further be improved. Here, the lower magnetic core 10 and the upper magnetic core 20 may be fixed to the housings 40 and 60 by adhesive, instead of the elastic members 70.

Second Embodiment

A second embodiment indicates an example in which two hall elements for measurement are used.

Figure 10A:
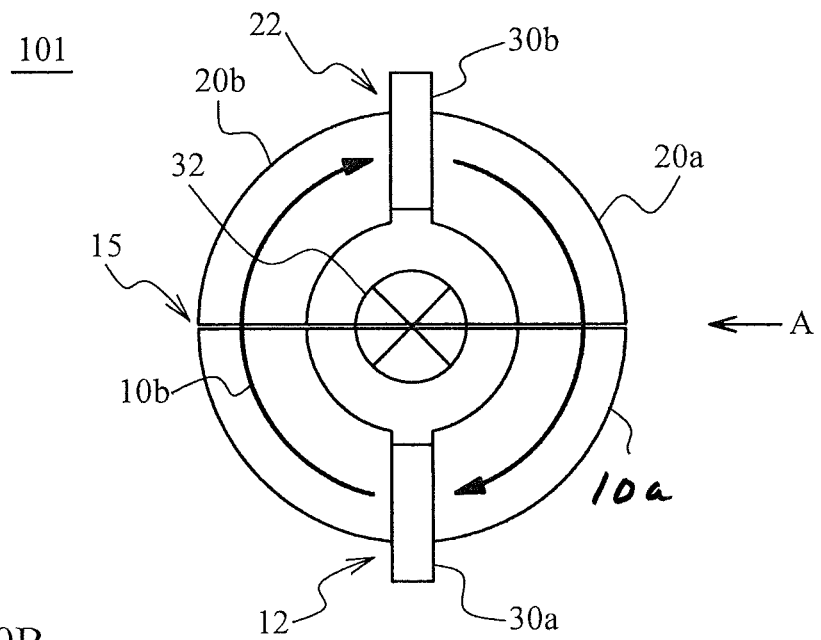
FIGS. 10A and 10B are diagrams illustrating a principle of a current sensor according to a second embodiment.
Figure 10B:
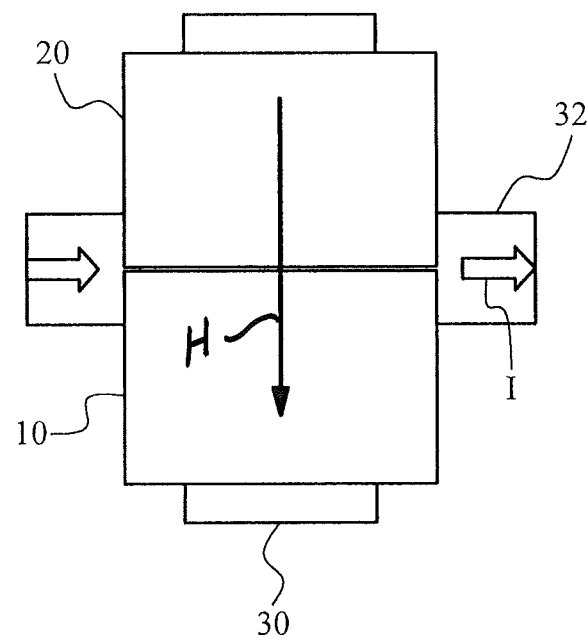

FIGS. 10A and 10B are diagrams illustrating a principle of a current sensor 101 according to a second embodiment, and correspond to FIGS. 1A and 1B according to the first embodiment. In the second embodiment, the upper magnetic core 20 is divided into two parts 20a, 20b, as with the lower magnetic core 10. A hall element 30b for the measurement of a magnetic field is arranged on a gap 22. Hereinafter, the gap and the hall element of the lower magnetic core 10 are referred to as the first gap 12 and a first hall element 30a, respectively. The gap and the hall element of the upper magnetic core 20 are referred to as a second gap 22 and the second hall element 30b, respectively. The substrate on which the first hall element 30a is mounted is referred to as a first wiring substrate 34a. Moreover, the substrate on which the second hall element 30b is mounted is referred to as a second wiring substrate 34b.

The current sensor 101 according to the second embodiment can obtain a differential signal by using the two hall elements on the first and the second wiring substrate 34a and 34b. Thereby, the influence on the measurement by an external magnetic field can be restrained, and measurement accuracy can be improved.

Figure 11:
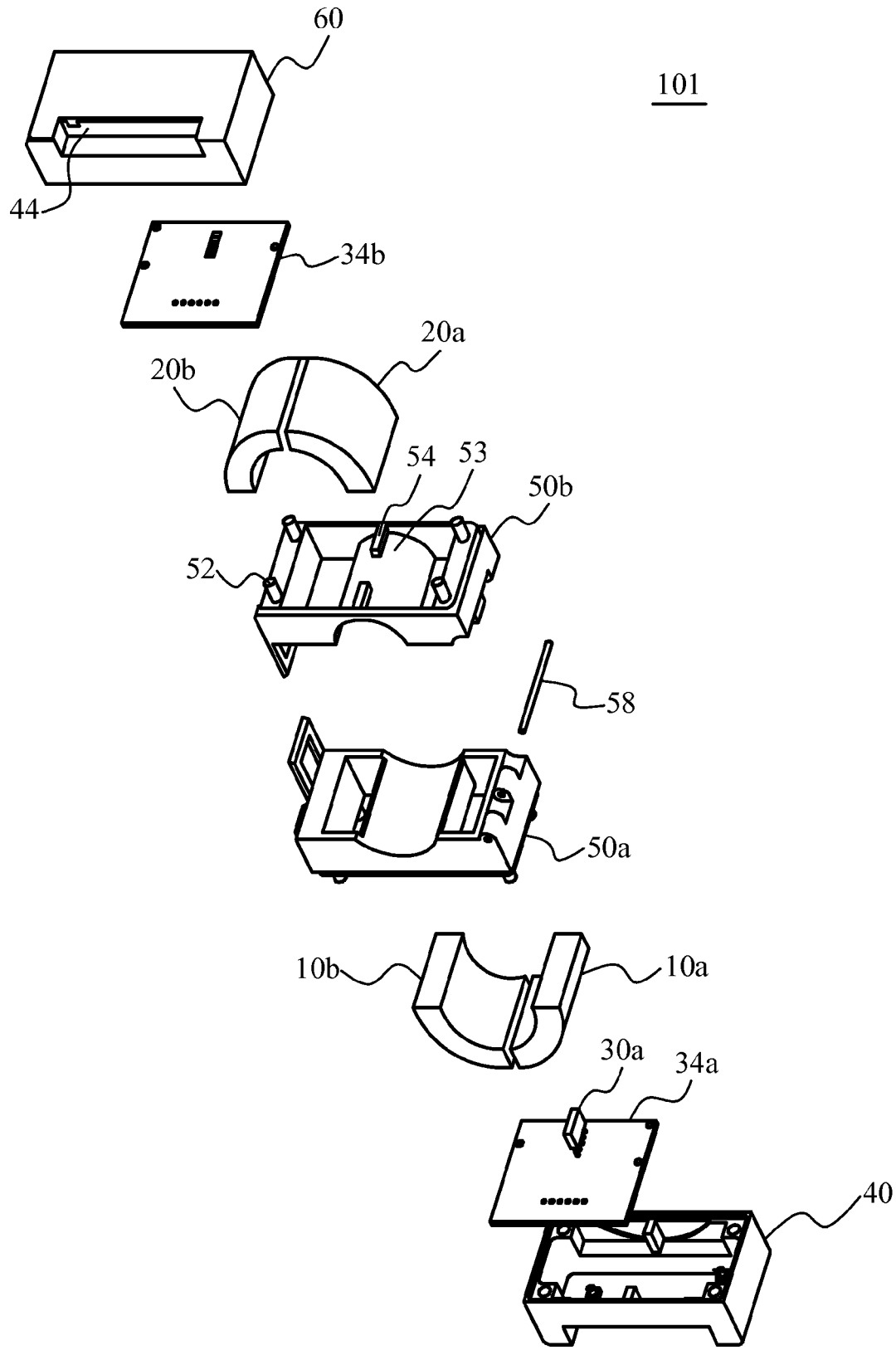
FIG. 11 is an exploded view of the current sensor according to the second embodiment.

FIG. 11 is an exploded perspective view of the current sensor according to the second embodiment, and corresponds to FIG. 2 according to the first embodiment. In the second embodiment, the same member as the lower housing 40 according to the first embodiment is used as the upper housing 60. Therefore, the lower housing 40 includes pin holes 41, separation portions 42, guide portions 43, and an opening portion 44, as illustrated in FIG. 3. Two members identical with the central housing 50 of the first embodiment are used as the central housing 50. A first central housing 50a located on the lower side in the drawing is engaged with the lower housing 40 by the pins 52, and a second central housing 50b located on the upper side in the drawing is engaged with the upper housing 60 by the pins 52.

Upper magnetic cores 20a and 20b are supported by the guide portion 53 of the second central housing 50b, and the contact of the upper magnetic cores 20a and 20b is prevented by the separation portions 54. Then, the second hall element 30b which is mounted on the second wiring substrate 34b illustrated in FIG. 13 is arranged on the second gap 22 between the upper magnetic cores 20a and 20b. In this state, the upper magnetic cores 20a and 20b are housed between the second central housing 50b and the upper housing 60. Similarly, the lower magnetic cores 10a and 10b are also arranged between the first central housing 50a and the lower housing 40. Since the lower magnetic cores 10a and 10b are the same as those of the first embodiment, a detailed explanation thereof is omitted.

The first central housing 50a and the second central housing 50b are rotatably mounted to each other by the bearing portions 55 opposed to each other and the shaft 58 which penetrates the bearing portions 55. The engagement convex portion 56 and the engagement frame portion 57 are formed on a side opposite to the bearing portions 55. The first central housing 50a and the second central housing 50b can be engaged with each other by the snap-fit structure, as with the first embodiment. As described above, the first central housing 50a and the second central housing 50b are the same members, and the bearing portions 55 and the engagement portions (i.e., the engagement convex portion 56 and the engagement frame portion 57) are formed on positions which serve as a point of symmetry, respectively. Therefore, the above-mentioned engagement is enabled.

Figure 12A:
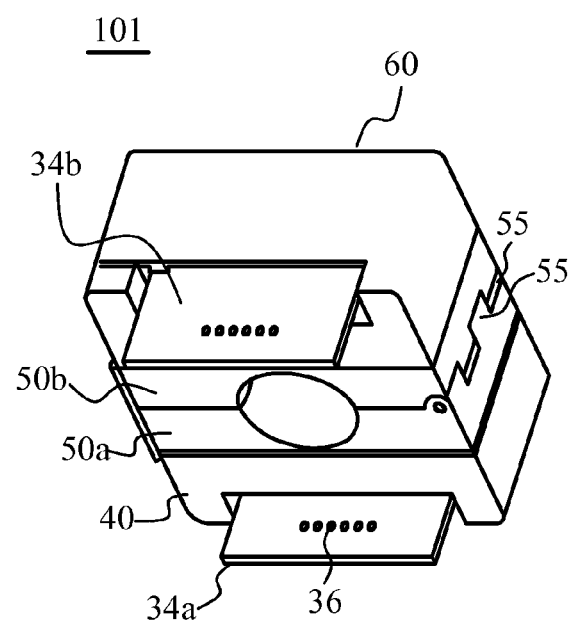
FIGS. 12A and 12B are diagrams of the assembled current sensor according to the second embodiment.
Figure 12B:
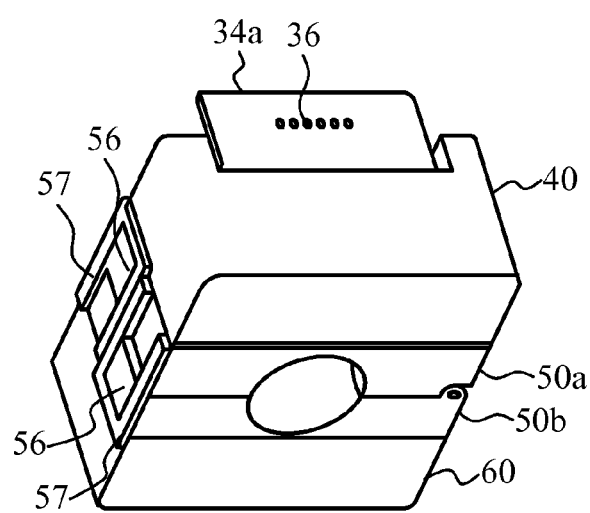

FIGS. 12A and 12B are perspective diagrams of the assembled current sensor 101 according to the second embodiment, and correspond to FIGS. 6A and 6B according to the first embodiment. The lower housing 40 and the first central housing 50a are detachably fixed to each other by the pins 52 and the pin holes 41, not shown. The upper housing 60 and the second central housing 50b are also detachably fixed to each other by the pins 52 and the pin holes 41, not shown. The first central housing 50a and the second central housing 50b are openably/closeably and detachably fixed to each other with the bearing portions 55, the shaft 58, the engagement convex portion 56 and the engagement frame portion 57.

The first wiring substrate 34a is inserted into the opening portion 44 of the lower housing 40. The second wiring substrate 34b is inserted into the opening portion 44 of the upper housing 60. Parts of the first wiring substrate 34a and the second wiring substrate 34b are exposed outward, and the terminal portion 36 for external connection is formed on each of exposed portions.

FIGS. 13A to 13E are plain views of the current assembled sensor 101 according to the second embodiment. FIG. 13F is a cross-section view of the current sensor 101, taken on a line A-A of FIG. 13D. As illustrated in FIG. 13A, the part of the second wiring substrate 34b is exposed from the upper housing 60. As illustrated in FIG. 13E, the part of the first wiring substrate 34a is exposed from the lower housing 40. As illustrated in FIGS. 13B and 13D, the first central housing 50a and the second central housing 50b are engaged with each other by the structure in which they are rotatably mounted to each other, and the snap-fit structure (56 and 57) provided on an opposite surface thereof. In the present embodiment, the upper magnetic core 20 (i.e., the upper magnetic cores 20a and 20b) is housed between the second central housing 50b and the upper housing 60 as illustrated in FIG. 13C, and hence the upper magnetic core 20 is not exposed outward, unlike the first embodiment. Thereby, the contact of the current bar 32 and the upper magnetic core 20 can be prevented more certainly.

According to the current sensor 101 of the second embodiment, since the upper magnetic core 20 is housed between the second central housing 50b and the upper housing 60, falling out of the two-divided upper magnetic core 20 can be prevented, and the upper magnetic core 20 can be fixed. Also in the current sensor using the two hall elements (30a, 30b), the magnetic cores are fixable by few members, as with the first embodiment. As a result, the current sensor which easily attaches and detaches the magnetic cores and is excellent in versatility can be obtained.

According to the current sensor 101 of the second embodiment, the same member as the central housing 50 of the first embodiment is used as the first central housing 50a and the second central housing 50b. The same member as the lower housing 40 of the first embodiment is used as the upper housing 60. Thus, the magnetic cores (10a, 10b, 20a and 20b) divided into four can be fixed using the same members as members used in the first embodiment. Therefore, the current sensor which is excellent in versatility of parts can be obtained.

According to the current sensor 101 of the second embodiment, the first central housing 50a is rotatably mounted on one side of the second central housing 50b, and the first central housing 50a and the second central housing 50b are engaged with each other by the engagement portions (i.e., the engagement convex portion 56, and the engagement frame portion 57) which are provided on another side opposed to the one side. Thereby, when the upper magnetic core 20 and the lower magnetic core 10 are replaced, the whole current sensor 101 does not need to be disassembled, and hence the lower magnetic core 10 and the upper magnetic core 20 can be detached and attached more easily. It is possible to detach and attach the lower magnetic core 10 and the upper magnetic core 20 more easily by making the structure of the engagement portions (56 and 57) into the snap-fit structure.

According to the current sensor 101 of the second embodiment, each of the lower housing 40 and the upper housing 60 includes two types of guide portions 43a and 43b, and can house the magnetic cores having different shapes. Although the second embodiment indicates an example in which the shape of the magnetic core is approximately a circle, as illustrated in FIG. 13F, the shape of the magnetic core may be approximately a rectangle, as illustrated in FIG. 8. Thus, the versatility of parts can be improved by making the lower housing 40 and the upper housing 60 into the shape corresponding to a plurality of kinds of magnetic cores.

Third Embodiment

A third embodiment indicates an example in which magnetic shield members are added.

Figure 14:
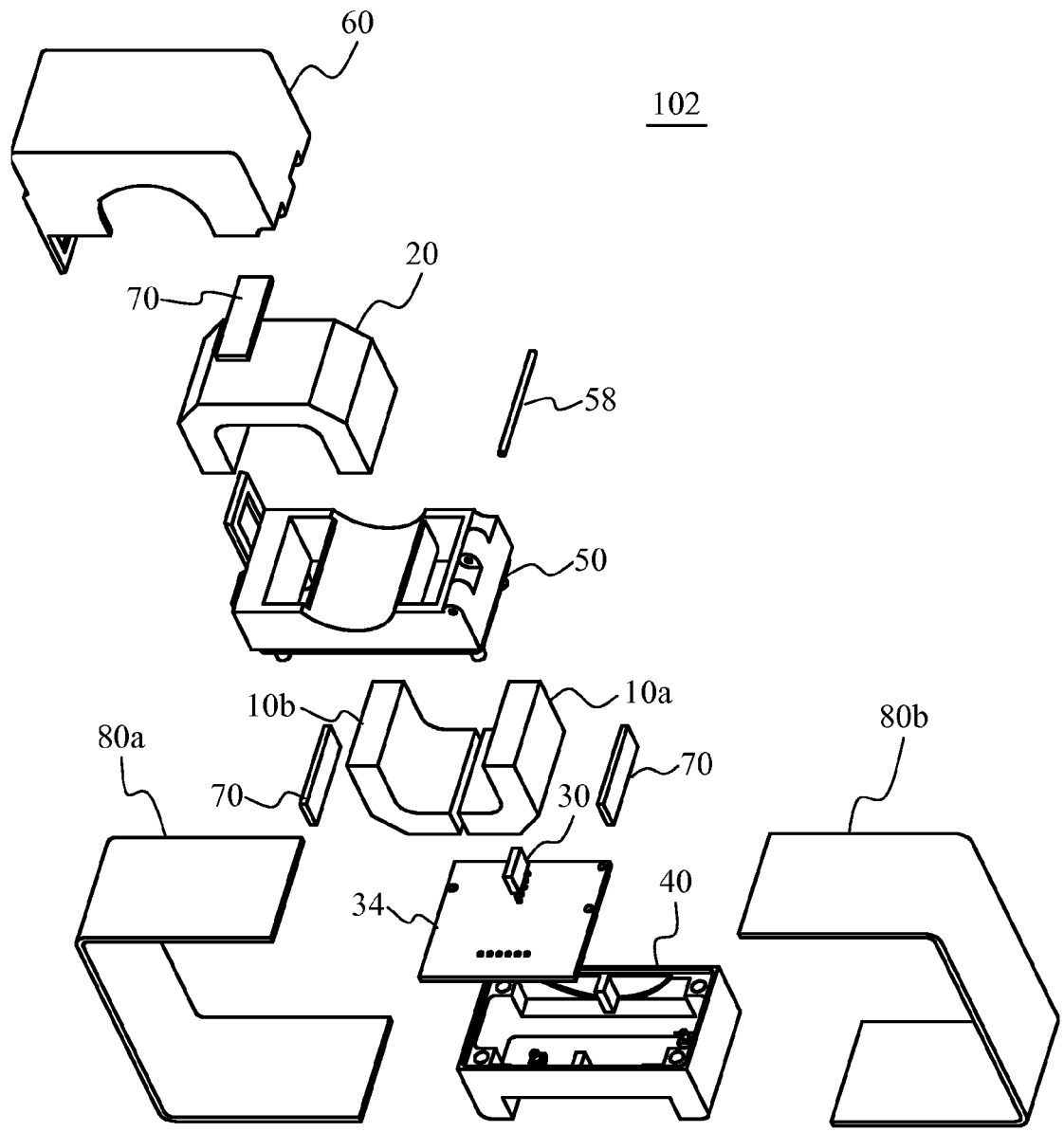
FIG. 14 is an exploded view of a current sensor according to a third embodiment.

FIG. 14 is an exploded view of a current sensor 102 according to a third embodiment. In the third embodiment, the rectangular magnetic cores as described in the variation example of the first embodiment are used as the lower magnetic core 10 and the upper magnetic core 20, but magnetic cores having a different shape may be used. In the third embodiment, the elastic members 70 described in the variation example of the first embodiment are optionally used.

In the third embodiment, the same member as the lower housing 40 of the first embodiment is used as the lower housing 40. In addition, the same member as the upper housing 60 of the first embodiment is used as the upper housing 60. In the third embodiment, the upper magnetic core 20 is not divided into two parts, but the two-divided upper magnetic cores 20a and 20b can be used as described in the second embodiment. In this case, the same composition as the second embodiment (i.e., the upper housing 60 and the second central housing 50b) can be employed in order to house the two-divided upper magnetic cores.

In the third embodiment, a U-shaped first magnetic shield member 80a and a U-shaped second magnetic shield member 80b are used. The first magnetic shield member 80a and the second magnetic shield member 80b are mounted so as to cover an outer circumference of the housings (i.e., the lower housing 40, the central housing 50 and the upper housing 60) of the current sensor. For example, permalloy, ferrite, the nanocrystal material with high permeability, nickel silver, and a cold rolled steel plate can be used as the first and the second magnetic shield members.

Figure 15A:
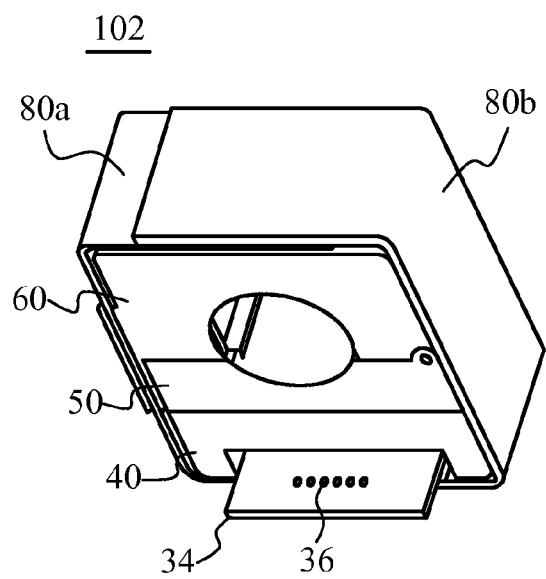
FIGS. 15A and 15B are appearance diagrams of the current sensor according to the third embodiment.
Figure 15B:
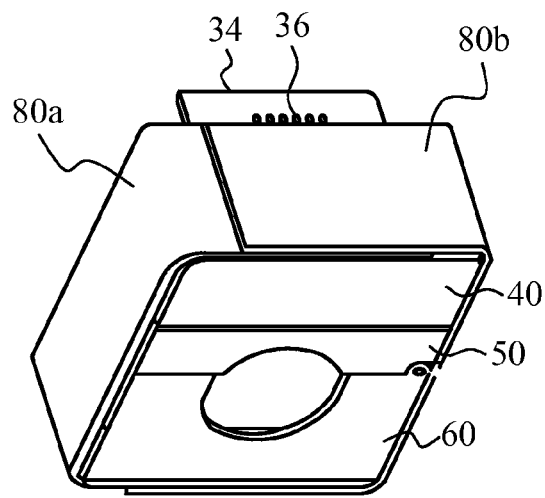

FIGS. 15A and 15B are diagrams of the assembled current sensor according to the third embodiment, and correspond to FIGS. 6A and 6B of the first embodiment. As illustrated in FIGS. 15A and 15B, the first magnetic shield member 80a covers a part of an outer circumference of the housings in the current sensor 102. The second magnetic shield member 80b covers a part of the outer circumference of the housings in the current sensor 102, and a part (i.e., end portions) of the first magnetic shield member 80a. Here, the first magnetic shield member 80a and the second magnetic shield member 80b are formed in the shape of sheet metal. The first magnetic shield member 80a and the second magnetic shield member 80b are engaged with each other by an elastic force acting on the outside magnetic shield member 80b from the inside first magnetic shield member 80a. Thereby, the magnetic shield members can be fixed to each other without using an adhesive.

FIGS. 16A to 16E are plain views of the assembled current sensor 102 according to the third embodiment, and FIG. 16F is a cross-section view of the current sensor 102, taken on a line A-A of FIG. 16D. The first magnetic shield member 80a and the second magnetic shield member 80b are mutually put together in a U shape and an inverse U shape.

According to the current sensor 102 of the third embodiment, an influence which an external magnetic field has on measurement can be restrained by the magnetic shield members (80a, 80b) provided in the perimeter of the sensor, and hence measurement accuracy can be improved. As described in the third embodiment, two magnetic shield members 80a, 80b which are in the shape of a curved board (i.e., U-shape) are combined and fixed, so that the magnetic shield members are easily attached and detached. Accordingly, it is possible to attach and detach the lower magnetic core 10 and the upper magnetic core 20 easily. Thereby, the current sensor which is excellent in versatility can be obtained.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A current sensor comprising:
   a lower housing;
   a lower magnetic core that is housed in the lower housing, and includes a first gap on which a first hall element for detection of a magnetic field is arrangeable;
   a central housing that detachably engages with the lower housing, and houses the lower magnetic core along with the lower housing;
   an upper magnetic core that is arranged on the central housing, and forms a ring structure with the lower magnetic core for surrounding a conductor; and
   an upper housing that detachably engages with the central housing via an engagement portion, and houses the upper magnetic core along with the central housing,
   wherein the engagement portion is on the upper housing and the central housing.

2. The current sensor as claimed in claim 1, wherein the central housing includes a frame body that fixes portions of the lower magnetic core and the upper magnetic core which are opposed to each other.

3. The current sensor as claimed in claim 1, wherein the lower magnetic core includes a first lower magnetic core and a second lower magnetic core, and the central housing includes a supporting structure for supporting the lower magnetic core along a ring structure, and an isolation structure for preventing the first lower magnetic core and the second lower magnetic core from contacting mutually at the first gap.

4. The current sensor as claimed in claim 1, wherein the upper housing is rotatably mounted on one side of the central housing, and the upper housing and the central housing are engaged with each other by the engagement portion which is provided on another side opposed to the one side.

5. The current sensor as claimed in claim 4, wherein the engagement portion is a two-part snap-fit structure.

6. The current sensor as claimed in claim 1, wherein the lower housing includes a plurality of supporting structures corresponding to a plurality of lower magnetic cores having different shapes, and the upper housing includes a plurality of supporting structures corresponding to a plurality of upper magnetic cores having different shapes.

7. The current sensor as claimed in claim 1, wherein the lower housing includes a first opening portion into which a first wiring substrate is capable of being inserted, the first hall element being mounted on the first wiring substrate.

8. The current sensor as claimed in claim 1, wherein the upper magnetic core includes a second gap on which a second hall element for detection of a magnetic field is arrangeable, the second hall element being different from the first hall element.

9. The current sensor as claimed in claim 8, wherein the central housing includes a first central housing that engages with the lower housing and houses the lower magnetic core, and a second central housing that engages with the upper housing and houses the upper magnetic core.

10. The current sensor as claimed in claim 9, wherein the first central housing is rotatably mounted on one side of the second central housing, and the first central housing and the second central housing are engaged with each other by the engagement portion which is provided on another side opposed to the one side.

11. The current sensor as claimed in claim 9, wherein the first central housing and the second central housing have identical structures.

12. The current sensor as claimed in claim 8, wherein the upper housing includes a second opening portion into which a second wiring substrate is capable of being inserted, the second hall element being mounted on the second wiring substrate.

13. The current sensor as claimed in claim 8, wherein the lower housing and the upper housing have identical structures.

14. The current sensor as claimed in claim 1, further comprising: an elastic member that is arranged on at least one of a space between the lower housing and the lower magnetic core, and a space between the upper housing and the upper magnetic core.

15. The current sensor as claimed in claim 1, further comprising: a magnetic shield member that covers an outer circumference of the lower housing, the central housing and the upper housing along the ring structure of the lower magnetic core and the upper magnetic core.

16. The current sensor as claimed in claim 15, wherein the magnetic shield member includes:
a first magnetic shield member that is in a shape of a curved board, and covers a part of the outer circumference of the lower housing, the central housing and the upper housing; and
a second magnetic shield member that is in a U-shape of a curved board, and covers a part of the first magnetic shield member and a part of the outer circumference of the lower housing, the central housing and the upper housing uncovered by the first magnetic shield member;
wherein the first magnetic shield member and the second magnetic shield member are engaged with each other by an elastic force acting on an overlap portion of the first magnetic shield member and the second magnetic shield member.

17. A current sensor comprising:
a lower housing;
a lower magnetic core that is housed in the lower housing, and includes a first gap on which a first hall element for detection of a magnetic field is arrangeable;
a central housing that detachably engages with the lower housing, and houses the lower magnetic core along with the lower housing;
an upper magnetic core that is arranged on the central housing, and forms a ring structure for surrounding a conductor along with the lower magnetic core; and
an upper housing that detachably engages with the central housing, and houses the upper magnetic core along with the central housing,
wherein the upper magnetic core includes a second gap on which a second hall element for detection of a magnetic field is arrangeable, the second hall element being different from the first hall element.

18. A current sensor comprising:
a lower housing;
a lower magnetic core that is housed in the lower housing, and includes a first gap on which a first hall element for detection of a magnetic field is arrangeable;
a central housing that detachably engages with the lower housing, and houses the lower magnetic core along with the lower housing;
an upper magnetic core that is arranged on the central housing, and forms a ring structure for surrounding a conductor along with the lower magnetic core;
an upper housing that detachably engages with the central housing, and houses the upper magnetic core along with the central housing; and
a magnetic shield member that covers an outer circumference of the lower housing, the central housing and the upper housing along the ring structure of the lower magnetic core and the upper magnetic core,
wherein the magnetic shield member includes:
a first magnetic shield member that is in a shape of a curved board, and covers a part of the outer circumference of the lower housing, the central housing and the upper housing;
a second magnetic shield member that is in a shape of a curved board, and covers a part of the first magnetic shield member and a part of the outer circumference of the lower housing, the central housing and the upper housing uncovered by the first magnetic shield member,
wherein the first magnetic shield member and the second magnetic shield member are engaged with each other by an elastic force acting on an overlap portion of the first magnetic shield member and the second magnetic shield member.

* * * * *